(12) United States Patent
Wen et al.

(10) Patent No.: US 11,448,966 B2
(45) Date of Patent: Sep. 20, 2022

(54) PHOTORESIST-REMOVING LIQUID AND PHOTORESIST-REMOVING METHOD

(71) Applicant: HUAYING RESEARCH CO., LTD, Wuxi (CN)

(72) Inventors: Sophia Z. Wen, Wuxi (CN); Fucheng Sun, Wuxi (CN); Zhikai Wang, Wuxi (CN)

(73) Assignee: HUAYING RESEARCH CO., LTD, Wuxi (CN)

( * ) Notice: Subject to any disclaimer, the term of this patent is extended or adjusted under 35 U.S.C. 154(b) by 418 days.

(21) Appl. No.: 16/633,159

(22) PCT Filed: Aug. 2, 2018

(86) PCT No.: PCT/CN2018/098332
§ 371 (c)(1),
(2) Date: Jan. 23, 2020

(87) PCT Pub. No.: WO2019/024892
PCT Pub. Date: Feb. 7, 2019

(65) Prior Publication Data
US 2021/0157242 A1   May 27, 2021

(30) Foreign Application Priority Data
Aug. 3, 2017   (CN) .......................... 201710657370.6
Oct. 18, 2017   (CN) .......................... 201710969167.2

(51) Int. Cl.
*C11D 7/50* (2006.01)
*G03F 7/42* (2006.01)
(Continued)

(52) U.S. Cl.
CPC ............... *G03F 7/425* (2013.01); *B08B 3/08* (2013.01); *C11D 7/04* (2013.01); *C11D 7/261* (2013.01);
(Continued)

(58) Field of Classification Search
CPC .................................................. C11D 11/0047
(Continued)

(56) References Cited

U.S. PATENT DOCUMENTS

2014/0155310 A1   6/2014   Phenis et al.
2018/0230405 A1*  8/2018   Kneer .................... C11D 3/042

FOREIGN PATENT DOCUMENTS

CN   101354542 A   1/2009
CN   101630127 A   1/2010
(Continued)

OTHER PUBLICATIONS

International Search Report and Written Opinion for International Application No. PCT/CN2018/098332 dated Oct. 25, 2018, 8 pages including 2 pages of English translation.

*Primary Examiner* — Gregory E Webb
(74) *Attorney, Agent, or Firm* — EcoTech Law Group, P.C.

(57) ABSTRACT

The present invention discloses a photoresist-removing solution comprising of an N-containing compound and an organic substance in a mass ratio of 1:(0.5-150). The N-containing compound includes at least one of the followings: tetraalkylammonium hydroxide, ammonia, liquid ammonia, and a mixture of ammonia and water; wherein the tetraalkylammonium hydroxide has the general formula (I):

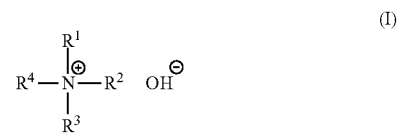

wherein $R^1$, $R^2$, $R^3$, $R^4$ is an alkyl with 1 to 4 carbons, respectively. The organic substance is an organic substance
(Continued)

having at least one electron-withdrawing functional group. The present invention mixes a specific kind of N-containing compound and a specific kind of organic substance in a certain ratio, and preferably adds a certain amount of water, so that the removal liquid in the present application has an extremely excellent photoresist-removing effect.

3 Claims, 2 Drawing Sheets

(51) Int. Cl.
  *B08B 3/08*    (2006.01)
  *C11D 7/04*    (2006.01)
  *C11D 7/26*    (2006.01)
  *C11D 7/32*    (2006.01)
  *C11D 11/00*   (2006.01)
  *H01L 21/027*  (2006.01)

(52) U.S. Cl.
  CPC ............ *C11D 7/264* (2013.01); *C11D 7/3209* (2013.01); *C11D 7/5022* (2013.01); *C11D 11/0047* (2013.01); *H01L 21/0273* (2013.01); *B08B 2203/005* (2013.01)

(58) Field of Classification Search
  USPC ......................................................... 510/175
  See application file for complete search history.

(56)     References Cited

FOREIGN PATENT DOCUMENTS

| | | |
|---|---|---|
| CN | 102893218 A | 1/2013 |
| CN | 105467783 A | 4/2016 |
| JP | S52-100234 A | 8/1977 |

* cited by examiner

PHOTORESIST-REMOVING LIQUID AND PHOTORESIST-REMOVING METHOD

CROSS-REFERENCE TO RELATED APPLICATION

This application claims the priority benefit of China Patent Application No. 201710657370.6, filed on Aug. 3, 2017 and China Patent Application No. 201710969167.2, filed on Oct. 18, 2017. The above-identified patent applications are hereby incorporated by reference in their entirety.

TECHNICAL FIELD

The invention relates to a photoresist-removing liquid and, more particularly, to a photoresist-removing liquid that can reduce corrosion of a substrate and a structure while rapidly removing the photoresist; and a method of removing the photoresist using the removal liquid.

BACKGROUND

Lithography is an important step in the semiconductor fabrication process that pattern a photoresist layer by using exposure and development, and then transfer the pattern on the photomask to a semiconductor wafer via an etch process. After the above steps are completed, the wafer can be selectively etched or ion implanted, and the undissolved photoresist will protect the covered wafer surface from being altered during these processes. After the above process ends, the photoresist needs to be removed and the wafer surface cleaned before other semiconductor device fabrication steps can be performed. Usually, many lithography processes are performed throughout the semiconductor device. Up to tens of the lithography steps may be required in the complex integrated circuit manufacturing process.

The photoresist removal is mainly divided into dry photoresist-removing and wet photoresist-removing. The materials that need to be removed are mainly the remaining photoresist and the polymer produced by the process. Dry photoresist-removing is a method of removing the photoresist and polymer mainly by using plasma. The wet photoresist-removing is a method of removing the photoresist and a polymer mainly by using a chemical solution. Dry photoresist-removing has advantages in removal ability, but the removal selection ratio between the photoresist to be removed and the substrate to be retained is difficult to increase. Wet photoresist-removing can achieve a high removal selectivity, but is limited by chemical solutions in terms of removal ability.

When the feature size of the device enters the process node below 65 nm, as the junction depth and film thickness decrease, the requirement for the removal selection ratio reaches a new height, which makes dry photoresist-removing unable to continue to meet the requirements of the removal selection ratio. The conventional wet photoresist-removing process formulations have also been unprecedentedly challenged in the removal selection ratio and the removal of the surface residual polymers.

In the wet photoresist-removing process, the main technology utilizes sulfuric acid, hydrogen peroxide and organic solvents such as NMP or EKC to remove photoresist.

The traditional photoresist-removing process requires immersing the wafer in solution of sulfuric acid and hydrogen peroxide at about 120 degrees Celsius for more than ten minutes. Moreover, since the solution has strong acidity and strong oxidizing property, it may corrode the metal layer underneath the photoresist or the silicon oxide underneath the photoresist causing the loss of the substrate materials. In addition, because of the strong acidity and strong oxidizability of the solution, there are ESH issues during the process.

The photoresist-removing process utilizing an organic solvent such as NMP or EKC also needs to be carried out at a temperature above 40 degrees Celsius, and takes 20 minutes or more to achieve the desired removal effect. This class of chemicals is considered a carcinogen and faces the challenge of exposing people to health and safety.

The above problems have made the industry urgently need a more ESH-compliant wet photoresist-removing process, which can effectively remove photoresist and polymer, improve the removal selection ratio, and at the same time, reduce the safety and health risks to the operators and minimize the negative impact on the environment.

SUMMARY

A purpose of the present invention is to develop chemical formulations and processes that can remove photoresist and polymers with shorter process times at lower reaction temperatures (even room temperature) with higher removal ratio(s) between photoresist/polymers and substrate materials.

The technical scheme of the present invention is a photoresist-removing liquid comprising an N-containing compound and an organic substance in a mass ratio of 1:(0.5-150). The N-containing compound including at least one of the followings: a tetraalkylammonium hydroxide, ammonia, liquid ammonia, and a mixture of ammonia and water; wherein the tetraalkylammonium hydroxide has the general formula (I):

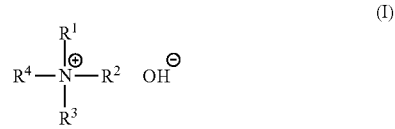

wherein $R^1$, $R^2$, $R^3$, $R^4$ is an alkyl group with 1 to 4 carbons, respectively; the organic substance is an organic substance with at least one electron-withdrawing functional group.

Further, the organic substance is an organic substance with at least one of the following functional groups: hydroxyl (—OH), carbonyl (—CO—), aldehyde (—CHO), carboxyl (—COOH), amino (—NH2), oxime (—C=NOH).

Further, the organic substance includes, but is not limited to the following organic substances: ethanol, propanol, isopropanol, acetone, ethyl acetate, acetic acid, trifluoroacetic acid and N-methyl pyrrolidone, acetaldehyde, acraldehyde, acrylic acid, phenol, diphenyl ketone, benzoic acid, 4-Methylbenzoic acid, 2-Aminotrifluoromethylbenzene, 2-(Trifluoromethyl)pyridine, 3,5-Diaminobenzotrifluoride, 4-Nitroaniline, acetaldehyde oxime, acetoxime, cyclohexanone oxime, dimethylbenzophenone oxime, ethylene glycol, propanetriol, hydroquinone, phloroglucinol, glyoxal, acetylacetone, benzoquinone, oxalic acid, malonic acid, maleic acid, phthalic acid, 3,5-Di(trifluoromethyl)aniline, 2,4,6-trinitroaniline, dimethylglyoxime, methylvinyldi(butylketoxime)silane, Phenyltris(methylethylketoximio)silane, Tetra-(methylethylketoxime)silane, p-Hydroxybenzaldehyde, p-Hydroxybenzoic acid, chloroacetic acid, fluoroacetic acid, p-Nitrophenylacetonitrile, o-Nitrophenol, 4-Chloroacetophenone oxime, ethyl chlorooximidoacetate, 3-Bromo-5-(trifluoromethyl)benzoic acid.

Further, the organic substance is isopropanol, ethanol or acetone.

Further, the removal liquid also includes water with the content of 0-60 wt. %. If the N-containing compound is a tetraalkylammonium hydroxide, the parts by weight of each component in the removal liquid are: 0.5-7.5 parts of tetraalkylammonium hydroxide, Water with the content of 22.5-30 wt. %, 30-80 parts of organic substance. If the N-containing compound is ammonia or liquid ammonia, the parts by weight of each component in the removal liquid are: 5-24 parts of ammonia or liquid ammonia, 10-85 parts of organic substance, and greater than 0 but no more than 60 parts of water. The N-containing compound is a mixture of ammonia and water, and the parts by weight of each component in the removal liquid are: 10-85 parts of organic substance, less than 60 parts of water, and 10-90 parts of a mixture of ammonia and water.

A photoresist-removing method uses the above removal liquid for photoresist removing.

Further, the method is performed by spraying the removal liquid onto the surface of the photoresist.

Further, the removal liquid is thoroughly mixed with the gas to form a gas-liquid mixed state, and then sprayed onto the surface of the photoresist.

Further, the gas is a mixture of one or more of ammonia, oxygen, nitrogen, air or ozone.

Further, the gas is air or oxygen, and the gas is partially or completely converted into ozone by the ozone generating device before being mixed with the removal liquid.

According to the above technical scheme, the present invention has the technical effect: the present invention mixes a specific type of the N-containing compound and a specific kind of organic matter in a certain ratio, and preferably adds a certain amount of water, so that the removal liquid in the present application has extremely excellent photoresist-removing effect; the details are as follows:

1. Improve the removal of photoresist and polymer by wet photoresist-removing as well as reduce corrosion on the wafer substrate, which can improve the process yield rate and provide an effective solution for the development of smaller process feature sizes.
2. The required photoresist-removing effect can be achieved at a lower temperature or even room temperature, which can solve or reduce the hidden dangers caused by the temperature control device in the traditional photoresist-removing process.
3. Reduce environmental pressure, reduce the impact on personnel health, and save on the cost of use.
4. Under the combined action of the chemical formulation and the process method of the present invention, a shorter process time can be used to achieve the desired photoresist-removing effect.
5. The process method of the invention generates a treatment liquid on-line through real-time mixing of gas and liquid, thereby improving the treatment efficiency and cleanliness of the chemical substance.
6. The above chemical formulations and processes can be applied to wafer surface cleaning in addition to photoresist removal.

DETAILED DESCRIPTION OF THE PREFERRED EMBODIMENTS

The invention is further illustrated by the following examples, which are merely illustrative of the invention, and the invention is not limited to the following examples.

Figure 1:
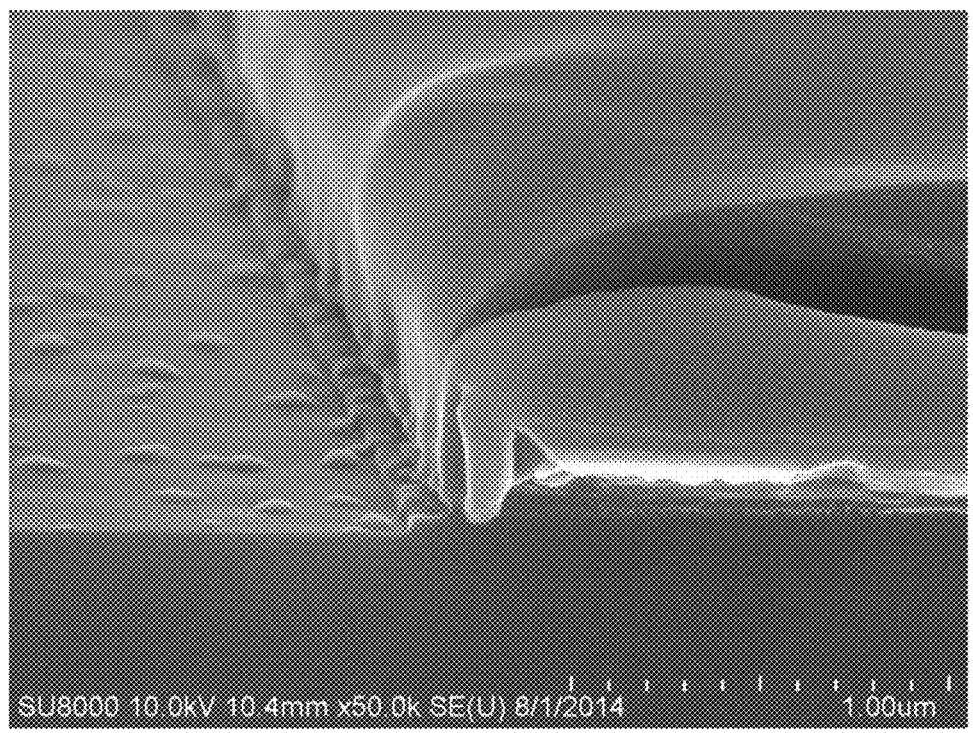
FIG. 1 is an SEM image of test wafer A of the present invention before testing.
Figure 2:
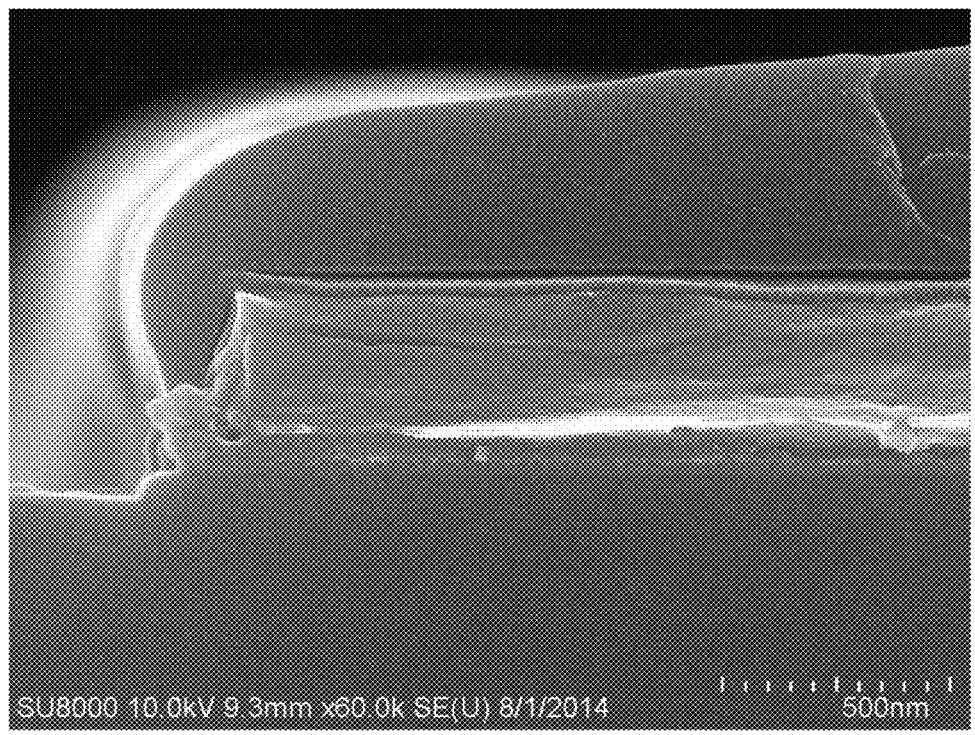
FIG. 2 is a cross-sectional view of FIG. 1.

In the following examples, the used chemical liquids are all electronic grades, wherein the mass concentration of ammonia water (mixture of ammonia and water) is 25-28%. For the convenience of calculation, the mass concentration of ammonia water in the following embodiments is 28% for calculation. In the following embodiments, the test wafer for testing the removal effect is prepared by applying a 1 micron thick positive photoresist currently used on the entire surface of the wafer by means of a rotating or sliding device (model AZ701, AZ Electronics Materials), which is pre-baked at a temperature of approximately 150° C. using a hot plate or an oven, exposed using photomasks with different patterns according to different wafers, developed, dried, post-baked, plasma etched, and then the test wafer is finally obtained; the test wafer is cut into squares having a width of about 1.5 cm according to different patterns, and the wafer mainly having a large-sized structure is the test wafer A, and the test is performed. The SEM image of wafer A before testing is shown in FIGS. 1-2. The wafer with long thin strip structure is the test wafer B, and the wafer with short thick strip structure is the test wafer C, and the removal effect test is performed separately.

Embodiment 1

Acetone and ammonia were mixed according to the mass ratio of Table 1, and several sets of removal liquids were obtained (Examples 1-14, the specific ratios are shown in Table 1).

TABLE 1

Acetone-Ammonia Water Removal Mixtures in Different Ratios

| Example | Acetone (wt. %) | Ammonia water (wt. %) | Ammonia in ammonia Water (wt. %) |
| --- | --- | --- | --- |
| 1 | 100 | 0 | 0 |
| 2 | 98.21 | 1.79 | 0.50 |
| 3 | 96.43 | 3.57 | 1.00 |
| 4 | 94.64 | 5.36 | 1.50 |
| 5 | 91.07 | 8.93 | 2.50 |
| 6 | 87.50 | 12.5 | 3.50 |
| 7 | 85.00 | 15 | 4.20 |
| 8 | 82.14 | 17.86 | 5.00 |
| 9 | 64.29 | 35.71 | 10.00 |
| 10 | 46.43 | 53.57 | 15.00 |
| 11 | 28.57 | 71.43 | 20.00 |
| 12 | 21.40 | 78.6 | 22.00 |
| 13 | 13.90 | 86.1 | 24.10 |
| 14 | 0.00 | 00 | 28.00 |

The removal effects of the removal solutions obtained in the above Examples 1-14 were tested by several processes. (In the test table for removal effect: evaluation from residual area, x—indicates almost no removal effect (residual >95%); Δ—indicates effect but not completely removed; ○—indicates no visible residual photoresist under 160 times microscope).

The specific method is listed hereafter.

Method 1: 14 test wafers A, test wafers B, and test wafers C were respectively taken, immersed in the removal liquid of the above Examples 1-14 at normal temperature, and shaken slightly, taken out after 1 minute, and blown dry with nitrogen. The final removal effect is shown in Table 2 by visual observation and microscopic observation.

TABLE 2

| Removal effect of immersion method | | | |
|---|---|---|---|
| Example | Test wafer A | Test wafer B | Test wafer C |
| 1 | x | x | x |
| 2 | x | x | x |
| 3 | x | x | x |
| 4 | x | x | x |
| 5 | x | x | x |
| 6 | Δ | Δ | Δ |
| 7 | Δ | Δ | Δ |
| 8 | Δ | Δ | Δ |
| 9 | Δ | Δ | Δ |
| 10 | Δ | Δ | Δ |
| 11 | Δ | Δ | Δ |
| 12 | Δ | Δ | Δ |
| 13 | Δ | Δ | Δ |
| 14 | x | x | x |

As shown in Table 2, the above removal solution and Method 1 did not remove the photoresist completely. In fact, Examples 9, 10, 11 and 12 work best, with only a small amount (<5%) of photoresist residual while the removal solutions of Examples 3 and 4 only enable lithography layer of the test wafer to be cracked and slightly thinned (residual area >99%).

If the immersion time is extended, the photoresist can be completely removed as the immersion time of the removal liquid using the removal liquids of Examples 8-12 reaches 3 minutes.

Method 2: The removal solution prepared in Examples 1-14 was mixed with oxygen through a mixing device, and then sprayed onto the test wafer A, the test wafer B, and the test wafer C at normal temperature for 1 minute; the wafers were dried using nitrogen gas and observed by naked eye and microscope. The final removal effect is shown in Table 3. In the experiment, the oxygen pressure was 10 psi, and the liquid pressure of the removal solution was 7 psi. The solution was sprayed through a 1/16 inch tube.

The above mentioned mixing device and mentioned mixing method can be referred to the description of the gas-liquid mixing device in another patent application of the applicant (WO/2016/023414).

TABLE 3

| i. Removal effect of spray method (1 minute) | | | |
|---|---|---|---|
| Example | Test wafer A | Test wafer B | Test wafer C |
| 1 | ○ | Δ | Δ |
| 2 | ○ | Δ | Δ |
| 3 | ○ | Δ | Δ |
| 4 | ○ | Δ | Δ |
| 5 | ○ | Δ | Δ |
| 6 | ○ | Δ | Δ |
| 7 | ○ | Δ | Δ |
| 8 | ○ | ○ | ○ |
| 9 | ○ | ○ | ○ |
| 10 | ○ | ○ | ○ |
| 11 | ○ | ○ | ○ |
| 12 | ○ | ○ | ○ |

TABLE 3-continued

| i. Removal effect of spray method (1 minute) | | | |
|---|---|---|---|
| Example | Test wafer A | Test wafer B | Test wafer C |
| 13 | ○ | ○ | ○ |
| 14 | Δ | Δ | Δ |

Figure 3:
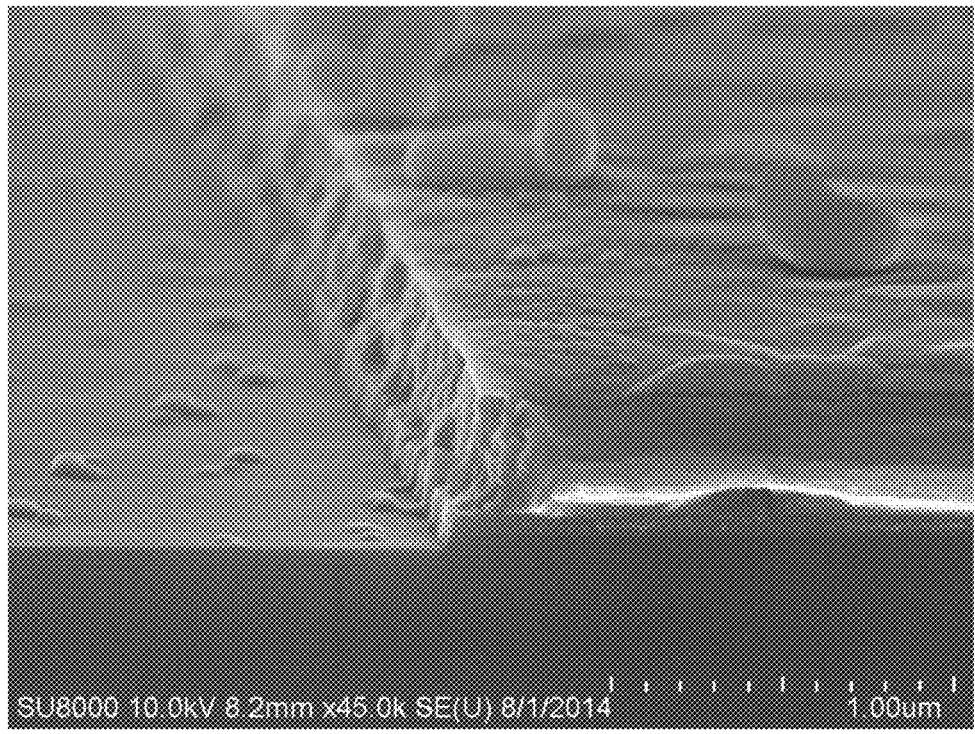
FIG. 3 is an SEM image of the same position of FIG. 1 after spraying for 1 minute using the formulation of Example 11.

It can be seen from Table 3 that the spray method can be better applied in the test wafer A mainly for the large-sized structure. For the test wafer B and the test wafer C that have smaller structures, the removal efficiency will deteriorate when the ammonia gas concentration is too low (Examples 1-7) or the acetone content is too low (Example 14). In the embodiment 14, the partial block photoresists detached from the surface of the wafer is reattached to the original photoresist at other positions again, indicating that the individual ammonia molecules or ammonia water in the removal liquid have a stripping effect and a dissolving effect on the photoresist. FIG. 3 is an SEM image of the formulation of Example 11 after 1 minute spraying.

When the oxygen in Method 2 is replaced with air or nitrogen, the removal effect is not significantly different from oxygen. However, when ozone was used instead of oxygen (using oxygen as a raw material and directly used to prepare ozone by a 5 g/L ozone generator), the removal liquid of Example 7 was used, and the photoresist residuals on the test wafer B and the test wafer C were not observed, indicating that the addition of ozone significantly contributes to the removal of the removal solution.

Utilizing the formulation of Examples 8-13 therein, the spray time of Method 2 was shortened to 35 s, and the results are shown in Table 4.

TABLE 4

| ii. Removal effect of spray method (35 s) | | | |
|---|---|---|---|
| Example | Test wafer A | Test wafer B | Test wafer C |
| 8 | ○ | Δ | Δ |
| 9 | ○ | Δ | Δ |
| 10 | ○ | Δ | Δ |
| 11 | ○ | Δ | ○ |
| 12 | ○ | ○ | ○ |
| 13 | ○ | Δ | Δ |

As shown in Table 4, under the shortening time, the removal effect of the removal liquid of Example 12 (acetone 21.40 wt. %, ammonia water 78.60 wt. %) was the best. In Example 12, by conversion, it was found that the mass ratio of acetone to ammonia was about 1:1.

Further, the removal liquid of Example 12 is directly flowed (ie, not mixed with oxygen or other gas, but directly sprayed) onto the surface of the test wafer in 35 seconds, which is dried by nitrogen then; it is found by microscopy that the photoresist on the wafer A (large pattern) and the test wafer C (short thick strip) were both removed well with no residue observed, and there was a very small amount of residue on the test wafer B (long strip).

For further illustrating the effect of water in the present invention, several sets of comparative examples are provided herein (Comparative Examples 1-8, specific ratios shown in Table 5).

TABLE 5 iii. acetone-ammonia water-water mixture removal liquid

| Example | Acetone (wt. %) | Ammonia (wt. %) | water (wt. %) |
|---|---|---|---|
| 1 | 21.4 | 5 | 73.6 |
| 2 | 21.4 | 15 | 63.6 |
| 3 | 5 | 5 | 90 |
| 4 | 15 | 15 | 70 |
| 5 | 26.2 | 5 | 68.8 |
| 6 | 23.4 | 15 | 61.6 |
| 7 | 5 | 22 | 73 |
| 8 | 15 | 22 | 63 |

In the above table, the mass percentage of ammonia is calculated by multiplying the mass percentage of ammonia by 28%, and the mass percentage of water is the mass percentage of ammonia multiplied by 72% plus the mass percentage of water added separately.

The removal liquid in the above comparative example was sprayed onto the surface of the test wafer A by the method 2, and after drying for 1 minute, it was blown with nitrogen and observed under a microscope. All the comparative solutions were not effective in removing the photoresist, and no significant change was observed in Comparative Examples 3, 4, 7, and 8. Comparative Example 1 showed little change, and only a small amount of cracks were observed (residual area >99%), the photoresist in Comparative Example 5 has more thinning phenomenon, and the majority of Comparative Example 6 is removed (residual area <60%), and the remaining portion is thinned, the similar parts of Comparative Example 2 and Comparative Example 6 were removed and the remaining parts were thinned. It can be seen that under this experimental condition, after adding excess water, the mass concentration of acetone or ammonia is reduced, so that the removal effect of the removal liquid is degraded.

Embodiment 2

The photoresist-removing liquid containing tetraalkylammonium hydroxide is further illustrated by the following examples 15-21. The proportions of the components in the above examples are shown in Table 6; in tetraalkylammonium hydroxide.

TABLE 6

Tetraalkylammonium hydroxide-organic-water mixed removal liquid

| Example | Tetraalkylammonium hydroxide (wt. %) | Water (wt. %) | Ethanol (wt. %) |
|---|---|---|---|
| 15 | 25 | 60 | 00 |
| 16 | 7.5 | 40 | 30 |
| 17 | 15 | 30 | 40 |
| 18 | 3 | 26 | 55 |
| 19 | 0.5 | 24 | 70 |
| 20 | 1.5 | 22 | 90 |
| 21 | 0 | 8 | 95 |

The above seven groups of photoresist-removing liquids were applied by spraying (mix nitrogen and removal liquid) for 3 min to remove the photoresist. The method was consistent with the examples, and the specific effects were as follows:

TABLE 7

Removal effect of tetraalkylammonium hydroxide-organic-water mixed removal solution

| Example | Test wafer A | Test wafer B | Test wafer C |
|---|---|---|---|
| 15 | Δ | x | x |
| 16 | Δ | x | x |
| 17 | Δ | x | x |
| 18 | ○ | ○ | ○ |
| 19 | Δ | Δ | Δ |
| 20 | Δ | Δ | x |
| 21 | x | x | x |

It can be seen from Table 7 that only when the tetraalkylammonium hydroxide, water and organic substance are within a certain range, the effect is better. On this basis, the tetraalkylammonium hydroxide in the mixture can achieve the desired photoresist-removing effect at a lower concentration. At very low concentrations (Example 19), the photoresist was removed, but the effect was weak. With the reduction of organic substance and even the absence of organic substance (Example 15), the removal ability of the mixture was also significantly weakened.

It should be noted that the above Examples 15-21 are only a brief introduction to the photoresist-removing liquids containing tetraalkylammonium hydroxide, wherein tetramethylammonium hydroxide can also use tetraalkylammonium hydroxide with 2-4 carbons, the weight ratio of organic substances can also be adjusted according to different photoresists, and the specific photoresist-removing method is not limited to the spray method, and the above immersion method, etc. can also be used for photoresist-removing. Utilizing the spray method, the gases such as oxygen, ozone, ammonia, etc. can also be selected.

In the present invention, the optimum ratio of the components and the optimum conditions of the process in the chemical formulation will vary depending on the composition and structure of the photoresist and the manufacturing process.

The above embodiments are merely illustrative of the technical concept and the features of the present invention, and the purpose of the present invention is to enable those skilled in the art to understand the present invention and to implement the present invention, and the scope of the present invention is not limited thereto. Equivalent variations or modifications made in accordance with the spirit of the invention are intended to be included within the scope of the invention.

What is claimed is:

1. A photoresist-removing method, comprising:
using a removal liquid to remove photoresist, wherein the removal liquid comprises an N-containing compound and an organic substance in a mass ratio of 1:(0.5-150), and the N-containing compound including at least one of the following: a tetraalkylammonium hydroxide, ammonia, liquid ammonia, and a mixture of ammonia and water; wherein the tetraalkylammonium hydroxide has the general formula (I):

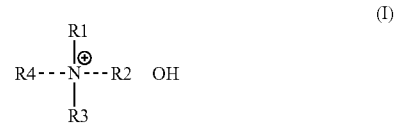

wherein R1, R2, R3, R4 is an alkyl with 1 to 4 carbons, respectively; wherein the organic substance is an organic substance with at least one electron-withdrawing functional group;

mixing the removal liquid with a gas to form a gas-liquid mixture; and spraying the gas-liquid mixture on a surface of the photoresist.

2. The photoresist-removing method of claim 1, wherein the gas is a mixture of one or more of ammonia, oxygen, nitrogen, air or ozone.

3. The photoresist-removing method of claim 1, wherein the gas is air or oxygen, and the gas is partially or completely converted into ozone by an ozone generating device before being mixed with the removal liquid.

* * * * *